(12) United States Patent
Hager

(10) Patent No.: US 6,919,728 B2
(45) Date of Patent: Jul. 19, 2005

(54) CALIBRATION CACHE AND DATABASE

(75) Inventor: Aaron Hager, Spring Valley, NY (US)

(73) Assignee: LeCroy Corporation, Chestnut Ridge, NY (US)

( * ) Notice: Subject to any disclaimer, the term of this patent is extended or adjusted under 35 U.S.C. 154(b) by 0 days.

(21) Appl. No.: 10/372,413

(22) Filed: Feb. 24, 2003

(65) Prior Publication Data

US 2003/0218466 A1 Nov. 27, 2003

Related U.S. Application Data

(60) Provisional application No. 60/360,544, filed on Feb. 27, 2002.

(51) Int. Cl.[7] .......................... G01R 35/00; G01R 1/02
(52) U.S. Cl. ...................................... 324/601; 324/130
(58) Field of Search ................................ 324/600, 601, 324/130, 202, 74, 158.1, 72.5, 121 R, 73.1, 113, 404, 638, 650, 754; 702/85, FOR 156; 73/465; D10/76; 968/853; 455/148; 368/115; 345/FOR 154

(56) References Cited

U.S. PATENT DOCUMENTS

| | | | | |
|---|---|---|---|---|
| 4,779,039 A | * | 10/1988 | Baker | 324/130 |
| 4,974,167 A | * | 11/1990 | Anderson et al. | 702/68 |
| 5,029,116 A | * | 7/1991 | Sugo | 434/379 |
| 5,175,492 A | * | 12/1992 | Wong et al. | 324/74 |
| 5,180,973 A | * | 1/1993 | Hoogendijk | 324/130 |
| 5,272,449 A | | 12/1993 | Izawa | |
| 5,375,067 A | * | 12/1994 | Berchin | 702/66 |
| 5,737,536 A | * | 4/1998 | Herrmann et al. | 709/229 |
| 6,202,212 B1 | * | 3/2001 | Sturgeon et al. | 725/141 |
| 6,269,317 B1 | * | 7/2001 | Schachner et al. | 702/91 |
| 6,289,418 B1 | * | 9/2001 | Koppala | 711/132 |
| 6,351,112 B1 | * | 2/2002 | Felps et al. | 324/72.5 |
| 6,466,006 B2 | * | 10/2002 | Alexander | 324/121 R |
| 6,580,071 B2 | | 6/2003 | Weinberger et al. | |
| 2003/0028631 A1 | * | 2/2003 | Rhodes | 709/224 |
| 2003/0112017 A1 | | 6/2003 | McPherson et al. | |

* cited by examiner

Primary Examiner—Anjan Deb
Assistant Examiner—Hoai-An D. Nguyen
(74) Attorney, Agent, or Firm—Frommer Lawrence & Haug LLP; William S. Frommer

(57) ABSTRACT

A method and apparatus for calibrating an oscilloscope and storing the calibration results for further use. Accordingly, an oscilloscope is provided with a calibration cache database for storing various calibration curves and their associated states. Each time the oscilloscope is calibrated, the resulting calibration curves are stored in the cache. When the oscilloscope returns to a previously calibrated state, the corresponding calibration curves are simply loaded from the cache to recalibrate the oscilloscope. After some period of use, many or most states for the oscilloscope will have entries in the database, and revisiting these states will no longer require recalculating the calibration curves.

10 Claims, 1 Drawing Sheet

CALIBRATION CACHE AND DATABASE

CROSS-REFERENCE TO RELATED APPLICATIONS

This application claims the benefit of U.S. Provisional Application Ser. No. 60/360,544 filed Feb. 27, 2002, the entire contents thereof being incorporated herein by reference.

FIELD OF THE INVENTION

The present invention relates generally to a method and apparatus for calibrating an oscilloscope and storing the calibration results.

BACKGROUND OF THE INVENTION

Digital storage oscilloscopes (DSOs) are designed to receive, capture and accurately display and analyze incoming signals as waveforms. Although oscilloscopes are precisely designed and constructed, many of the components may be slightly mismatched in their operating characteristics (i.e. they are not identical). This is because manufacturing tolerances allow for variation between components even though they are produced to the same specifications. Further, the operating characteristics of these components may vary as a function of temperature, operating lifetime and scope settings. Hence, inconsistencies may occur between readings when a characteristic of a particular oscilloscope has changed.

In order to overcome these variations, certain oscilloscopes—such as LeCroy digital oscilloscopes—self-calibrate in real time by measuring curves to characterize the varying components. A calibration is performed whenever the oscilloscope senses a change in any variable—such as temperature, time or scope settings—that might affect the characteristics of any one or more internal components of the digital oscilloscope. However, calibration is a time-consuming process, which results in a noticeable delay in processing in order to perform the calibration process. This calibration process therefore delays the ability to acquire and process other incoming data.

Furthermore, calibration measurements require switching several relays in order to properly connect the apparatus to perform this calibration. As these relays have relatively short life spans, excessive calibration increases the failure rate of these digital oscilloscopes.

Thus a need exists to speed the calibration process in DSOs and to do so without decreasing the life of the scope.

Accordingly, the present invention is a method and apparatus which allows for proper calibration of a DSO when a characteristic has changed, without a noticeable delay in the operation of the scope.

SUMMARY OF THE INVENTION

Therefore, it is an object of the present invention to provide a method and apparatus for calibrating an oscilloscope and storing the calibration results for future use. Accordingly, an oscilloscope is provided with a calibration cache database for storing various calibration curves and their associated states. Each time the oscilloscope is calibrated, the resulting calibration curves are stored in the cache. When the oscilloscope returns to a previously calibrated state, the corresponding calibration curves are simply loaded from the cache to recalibrate the oscilloscope. After some period of use, many or most states for the oscilloscope will have entries in the database, and revisiting these states will no longer require recalculating the calibration curves.

In a preferred embodiment of invention, the method detects a change in at least one of a plurality of characteristics that requires calibration of the digital oscilloscope. The method then determines the state of the digital oscilloscope. If the state is present in the cache or database memory of the oscilloscope, the calibration curve corresponding to the state is loaded from the cache or database, thereby calibrating the digital oscilloscope. If the state is not present in the cache or the database, then a calibration curve corresponding to the state is generated and the calibration is performed.

Other aspects of the invention are that the plurality of characteristics includes settings on the oscilloscope, temperature, and time between calibrations. The calibration curves may be analyzed to provide data on the oscilloscope's variation with respect to the plurality of characteristics. The cache stores recently used calibration curves and the database stores all calibration curves.

The cache greatly reduces calibration time, speeds up performance, and decreases the failure rate of the oscilloscope. The calibration database also provides invaluable data for analyzing the oscilloscope's variation with respect to temperature, time and settings, and the effect of these various parameters on the overall functionality and performance of the oscilloscope.

Still other objects and advantages of the invention will in part be obvious and will in part be apparent from the specification and the drawings.

The invention accordingly comprises the several steps and the relation of one or more of such steps with respect to each of the others, and the apparatus embodying features of construction, combination(s) of elements and arrangement of parts that are adapted to effect such steps, all as exemplified in the following detailed disclosure.

BRIEF DESCRIPTION OF THE DRAWING

For a more complete understanding of the invention, reference is made to the following description and accompanying drawing, in which.

DETAILED DESCRIPTION OF THE PREFERRED EMBODIMENTS

Figure 1:
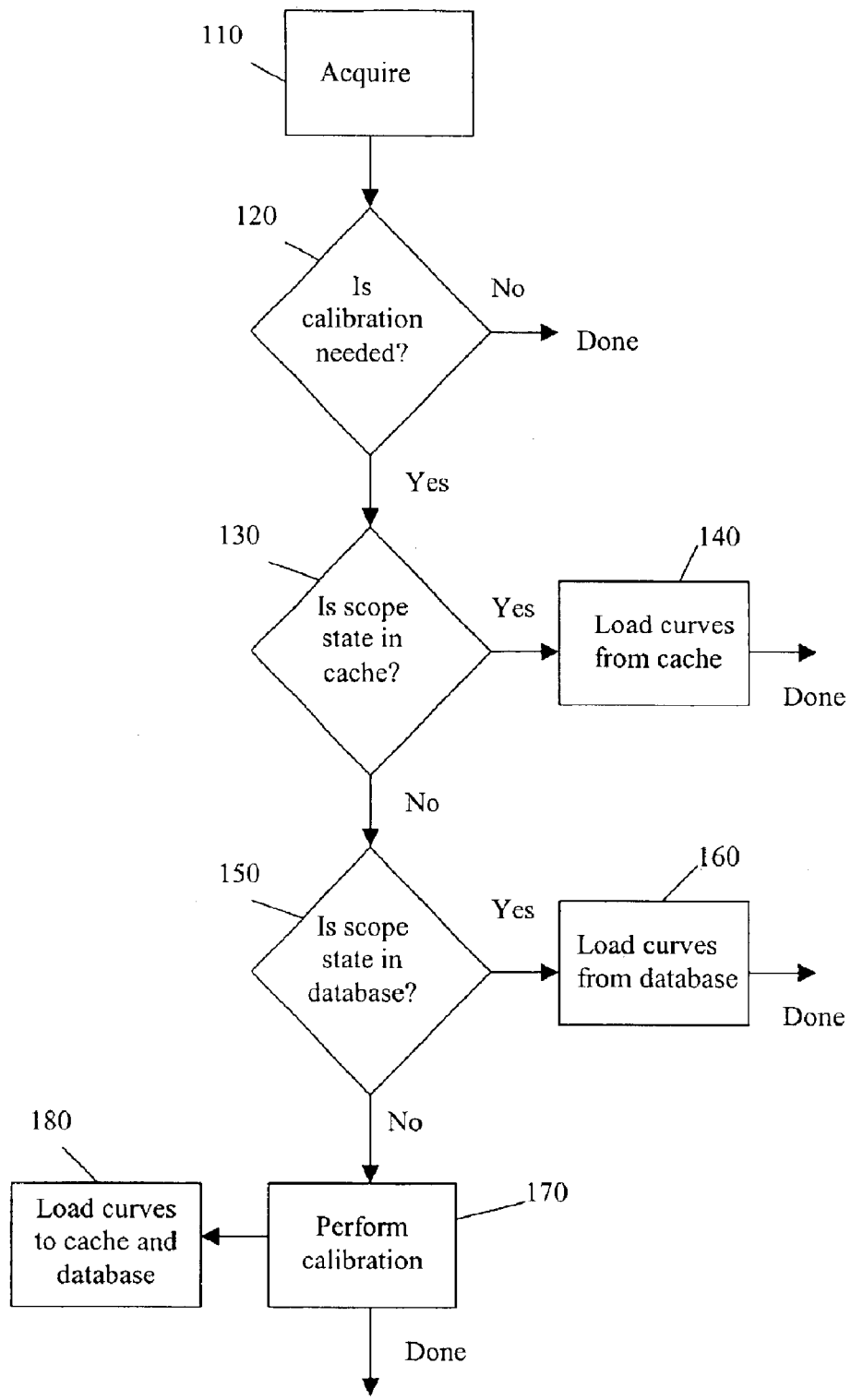
FIG. 1 is a flow chart diagram depicting a method in accordance with the invention.

The preferred embodiments of the apparatus and method according to the present invention will be described with reference to the accompanying drawings.

In accordance with the present invention, an oscilloscope is provided with a calibration database to store various calibration curves and their associated states. Once such a database has been built up, much of the effort involved in recalibrating the oscilloscope is eliminated. When the oscilloscope returns to a state that has been previously calibrated, the calibration curves are simply reloaded from memory to set the various parameters of the oscilloscope, and recalibration is not needed. Thus, every time the oscilloscope is calibrated, the calibration curves are added to the calibration database for later use. After some period of use, many or most of the states of the oscilloscope will have entries in the database, and revisiting these states will not require additional calibration.

Furthermore, in addition to greatly reducing the calibration time, decreasing the failure rate, and speeding up performance of the oscilloscope, the calibration database provides invaluable data for analyzing the oscilloscope's variation with respect to temperature, time and oscilloscope settings and the effect of these various parameters on the overall functionality and performance of the oscilloscope.

While simply retrieving calibration curves from a database is faster than a complete recalibration, searching such a database for the appropriate curve still may result in a processing delay, especially as the database grows larger. Therefore, a small memory cache may be provided, in addition to the calibration curve database, to store the most recent (preferably five to ten) state calibration curves, for the oscilloscope. For example, if the user turns a knob, thereby moving the oscilloscope from a first state to a second state, and then turns the knob immediately back again, thereby moving the oscilloscope from the second state back to the first state, the calibration curves that were generated when the oscilloscope was in the first state can instantly be reloaded from the cache and the database need not be searched. If the oscilloscope is returned to a state that had been accessed by the oscilloscope awhile ago, the calibration curve corresponding to the present state of the oscilloscope would be loaded from the database. Finally, if the oscilloscope is put into a new state, then an actual calibration is performed and the new calibration parameters/curves are entered into the database cache, as noted above. Therefore, in accordance with this approach, calibration is performed only when necessary and the lifetime, performance, and speed of the oscilloscope can be improved.

In another embodiment of the invention, these calibration curves may be removed from the database after a predetermined period of time to avoid becoming stale.

As shown in FIG. 1, at step 110 an incoming waveform is acquired by the scope. At step 120, an inquiry is made as to whether the DSO needs to be calibrated. As noted above, this inquiry is determined based upon whether the particular state of the oscilloscope has changed from the last time a calibration was performed, or the last time calibration parameters were loaded into the oscilloscope memory. If this inquiry is answered in the negative, then calibration is not required and the acquisition of the incoming waveform may proceed.

If the inquiry at step 120 is answered in the affirmative, calibration is needed. Then at step 130 an inquiry is made as to whether a calibration curve is stored in the cache corresponding to the present state of the oscilloscope. If this inquiry is answered in the affirmative, and it is determined that the cache includes a calibration curve corresponding to the present state of the oscilloscope, then at step 140 the calibration curves are loaded from the cache into the oscilloscope and the acquisition procedure continues.

If at step 130 the inquiry is answered in the negative and it is determined that calibration curves corresponding to the present oscilloscope state are not contained in the cache, then control passes to the inquiry at step 150 where it is determined whether calibration curves corresponding to the current state of the oscilloscope are contained in the database. If this inquiry at step 150 is answered in the affirmative, and it is determined that calibration curves corresponding to the current oscilloscope state are contained in the database, then at step 160 these calibration curves are loaded from the database into the oscilloscope and the acquisition procedure proceeds as noted above.

If at step 150, the inquiry is answered in the negative, and it is therefore determined that calibration curves corresponding to the current state of the oscilloscope are not contained in the database, then control passes to step 170 where traditional calibration is performed. After performance of this calibration, the acquisition procedure noted above is performed and the calibration curves generated at step 170 are loaded to the cache and database in step 180. Thereafter, when this particular state of the oscilloscope is revisited, these determined calibration curves are present in the database (for a long period of time) or in the cache (for a shorter period of time until a number of other states are calibrated and the calibration curve is bumped to the database). Thus, these new calibration curves are available to the oscilloscope the next time the present state of the oscilloscope is revisited.

Therefore, in accordance with the invention, an improved oscilloscope calibration apparatus is provided allowing for a reduction in the amount of time for calibration and for a reduction in the number of times calibration is performed, thereby prolonging the life of the oscilloscope in accordance with the invention and providing a more desirable response time for the apparatus.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. A method of calibrating a digital oscilloscope, comprising the steps of:
   detecting a change in at least one of a plurality of characteristics of the digital oscilloscope, which has a fixed physical configuration with regard to a connection or connections for receiving incoming signals, that requires a calibration of the digital oscilloscope be performed;
   determining a state of the digital oscilloscope;
   loading a calibration curve corresponding to the state from a cache memory if the state is present in the cache, thereby calibrating the digital oscilloscope;
   loading the calibration curve corresponding to the state from a database memory if the state is present in the database, thereby calibrating the digital oscilloscope;
   performing the calibration by generating the calibration curve corresponding to the state if the state is not present in the cache or the database; and
   storing the generated calibration curve in the cache and the database.

2. The method of claim 1, wherein said plurality of characteristics includes settings on the oscilloscope, temperature, and time between calibrations.

3. The method of claim 1, wherein the cache stores one or more recently used calibration curves and the database stores all calibration curves.

4. The method of claim 1, wherein the calibration curves are analyzed to provide data on the oscilloscope's variation with respect to said plurality of characteristics.

5. The method of claim 1, whereby the method reduces calibration time, increases performance, and decreases the failure rate of the oscilloscope.

6. A digital oscilloscope, comprising:
   detecting means for detecting a change in at least one of a plurality of characteristics of the digital oscilloscope, which has a fixed physical configuration with regard to a connection or connections for receiving incoming signals, that requires a calibration of the digital oscilloscope be performed;

determining means for determining a state of the digital oscilloscope;

loading means for loading a calibration curve corresponding to the state from a cache memory if the state is present in the cache, thereby calibrating the digital oscilloscope, said loading means loading the calibration curve corresponding to the state from a database memory if the state is present in the database, thereby calibrating the digital oscilloscope; and calibration means for performing the calibration by generating the calibration curve corresponding to the state if the state is not present in the cache or the database, and storing the generated calibration curve and the corresponding state in the cache and the database.

7. The digital oscilloscope of claim 6, wherein said plurality of characteristics includes settings on the oscilloscope, temperature, and time between calibrations.

8. The digital oscilloscope of claim 6, wherein the cache stores recently used calibration curves and the database stores all calibration curves.

9. The digital oscilloscope of claim 6, wherein the calibration curves are analyzed to provide data on the oscilloscope's variation with respect to said plurality of characteristics.

10. The digital oscilloscope of claim 6, whereby use of the cache and the database reduces calibration time, increases performance, and decreases the failure rate of the oscilloscope.

* * * * *